United States Patent [19]

Harra

[11] Patent Number: 5,314,597
[45] Date of Patent: May 24, 1994

[54] SPUTTERING APPARATUS WITH A MAGNET ARRAY HAVING A GEOMETRY FOR A SPECIFIED TARGET EROSION PROFILE

[75] Inventor: David J. Harra, San Francisco, Calif.

[73] Assignee: Varian Associates, Inc., Palo Alto, Calif.

[21] Appl. No.: 855,988

[22] Filed: Mar. 20, 1992

[51] Int. Cl.⁵ .............................................. C23C 14/34
[52] U.S. Cl. .......................... 204/192.13; 204/192.12; 204/298.19; 204/298.2
[58] Field of Search ...................... 204/192.12, 192.13, 204/298.19, 298.2, 298.21, 298.22

[56] References Cited

U.S. PATENT DOCUMENTS

| | | | |
|---|---|---|---|
| 4,444,643 | 4/1984 | Garrett | 204/298 |
| 4,606,806 | 8/1986 | Helmer | 204/298 |
| 4,872,964 | 10/1989 | Suzuki et al. | 204/298 |
| 4,995,958 | 2/1991 | Anderson et al. | 204/298 |

FOREIGN PATENT DOCUMENTS 61-52814 9/1987 Japan .

Primary Examiner—Nam Nguyen

[57] ABSTRACT

A rotatable magnet configuration for use in a magnetron sputtering system for obtaining a desired sputter target erosion profile and for obtaining a sputtered film on a substrate having a desired film characteristic, such as uniformity of thickness, and a method of designing such a magnet configuration are disclosed. The disclosed design and method compensate for the discrepancy between the between the actual position of the magnet and the "effective" position of the magnet as measured by a static erosion profile obtained holding the magnet stationary. The method shown describes how to adjust the actual shape of the magnet to obtain a desired effective shape that will produce a predetermined erosion profile in the sputter target. In addition, the disclosure describes how to determine an optimal erosion profile to produce a sputtered film having a desired characteristic.

30 Claims, 10 Drawing Sheets

SPUTTERING APPARATUS WITH A MAGNET ARRAY HAVING A GEOMETRY FOR A SPECIFIED TARGET EROSION PROFILE

FIELD OF THE INVENTION

This invention relates to sputtering apparatus and, in particular, to a magnetron sputtering apparatus using a generally heart-shaped, closed-loop rotatable magnet array.

BACKGROUND OF THE INVENTION

Physical vapor deposition by sputtering is a well known process that has found widespread application in the fabrication of integrated circuit semiconductor devices. In semiconductor device fabrication, a large number of integrated circuit devices are normally formed on a thin, generally circular semiconductor substrate referred to as a wafer. Integrated circuit device fabrication involves a large number of processing steps, with sputtering typically being used to provide metallization layers and interconnects between device layers. Most commonly, sputtered aluminum is the material used for these purposes. Modern semiconductor processing has also seen the increased use of sputtered tungsten, tungsten silicide, titanium, titanium nitride and other films.

A magnetron sputtering source is capable of high rate sputtering and represents an enormous improvement over devices forming thin films based on diode sputtering or evaporative techniques. Magnetron sputtering sources are routinely used by the semiconductor processing industry to coat semiconductor wafers during the manufacture of integrated circuits.

In magnetron sputtering a plasma is formed in a low pressure inert gas by the application of a suitable voltage. The plasma is confined to a region near a sputter target, which is made of the material to be sputtered and which usually serves as the cathode of the system. A magnetic field, typically having field lines which loop through the sputter target surface, restricts the trajectories of the electrons in the plasma, thereby intensifying and confining the plasma. Ions in the plasma bombard the sputter target dislodging atoms of the target material which are then deposited on a substrate.

In recent years wafer sizes have continually increased, and now the use of eight-inch diameter wafers is common in the industry. Large wafer sizes permit a larger number of integrated circuit devices to be grown on a single substrate. However, larger wafer sizes impose greater demands on sputtering systems. For example, one requirement of a sputtering system used in semiconductor processing is that it deposit a layer of uniform thickness over the entire wafer surface. (Hereinafter the term uniformity will be used in connection with the thickness of the deposited film unless the context suggests otherwise.) Lack of uniformity may result in lowered device yield (i.e., the percentage of devices which meet operating specifications) and/or variations in device performance. Larger wafer sizes make it more difficult to achieve very demanding levels of uniformity. Likewise, the trend towards ever smaller integrated circuit device geometries has required that even greater levels of sputtered film uniformity be achieved.

Other sputtered film characteristics are also quite important to integrated circuit device manufacturers. For example, as noted above, sputtered conductive material is frequently used to form interconnects between device layers. Forming interconnects involves uniformly filling small diameter holes, called vias, in the surface of the wafer. As integrated circuit device geometries have shrunk, the difficulty in filling vias with sputtered material has increased appreciably. Step coverage, or the ability of the sputtered film to evenly conform to angular features on the wafer surface is, likewise, another important film characteristic.

An earlier approach to improving the uniformity and step coverage characteristics of a sputtering system is to sputter from two concentric targets. For an example of this approach see U.S. Pat. No. 4,606,806 which describes a sputtering source sold by the assignee of the present invention under the trademark ConMag ® II. In the ConMag ® II sputtering source each of the sputter targets has a unique shape and its own separate power supply enabling separate control over the sputtering rate from each target.

A number of commercially available sputtering sources use planar sputtering targets. Early designs, wherein the planar magnetron sputtering device used a stationary magnet had practical shortcomings, the most serious of which is that the plasma discharge is localized and erodes a narrow groove in the target in the vicinity of the greatest magnetic field strength. This localized erosion generates a non-uniform distribution of sputtered atoms from the target and a film with non-uniform thickness on the semiconductor wafer. The non-uniform erosion of the sputter target leads to inefficient target utilization. Given the high cost of the sputter targets used in semiconductor manufacture, it is important to obtain the greatest possible target utilization that is consistent with the need for sputtered film uniformity and other required sputtered film characteristics.

Numerous attempts, some partially successful, have been made to modify the planar magnetron source to extend the target erosion and to make the distribution of sputtered atoms more uniform. Attempts have been made to spread out the erosion over a larger surface area using extended magnetic fields. The magnets required for such an approach are large and complicated, and it is difficult to assure that the properties of the magnetron do not change as the target erodes away. The resulting erosion pattern is thus difficult to predict.

U.S. Pat. No. 4,444,643, which is incorporated herein by reference, describes a sputtering device which includes a mechanically rotated annular permanent magnet assembly. The rotation of the permanent magnet assembly causes erosion over a wider area of the target. A version of the sputtering source described in the '643 patent has been sold commercially by the assignee of the present invention under the trademark VersaMag ™. This source relies on a rotating magnet mounted behind the target for moving the plasma over the face of the target. Rotation of the plasma was introduced for the purposes of improving uniformity and step coverage, as well as improving the uniformity of target erosion so that targets are more efficiently utilized.

The VersaMag sputtering source, while a significant improvement over planar magnetron sources employing stationary magnets, nonetheless did not produce truly uniform sputtered film nor uniform target utilization. Thus, efforts have been made to develop improved rotating magnet designs for use with planar targets. (The term "planar target" is intended throughout this specification to be descriptive of the sputter target surface before it is eroded. Those skilled in the art will recognize that after the target has been eroded it may no longer have a planar surface.)

One direction that has been taken by those seeking to improve the design of rotating magnets used with planar magnetron sputtering sources has been the used of closed-loop, generally heart-shaped magnet configurations. Such magnet configurations typically employ an array of magnets which are centered along a line defining a heart-shaped, closed loop.

One such arrangement is described in U.S. Pat. No. 4,872,964, entitled "Planar Magnetron Sputtering Apparatus And Its Magnetic Source", issued Oct. 10, 1989 to Suzuki, et al. Suzuki, et al., review the shortcomings of a sputtering source of the type described in the '643 patent and describe a heart-shaped rotating magnet array which is said to produce more uniform target erosion. However, the Suzuki, et al., patent overly simplifies the mathematics of the situation and, therefore, does not fully teach how to obtain truly uniform target erosion. In apparent recognition of this shortcoming, Suzuki, et al., describe the need to adjust the magnet array, after it has been laid out in accordance with their mathematical analysis, "to get more uniform erosion after a test run of the sputtering apparatus." (Col. 5, lines 27–28.) Unfortunately, Suzuki, et al., do not teach any methodology for making the necessary adjustments. The teachings of Suzuki, et al., are directed to how to obtain uniform erosion of the target. While uniform target erosion is important, the characteristics of the sputtered film, such as uniformity, are of greater importance to integrated circuit device manufacturers. In many instances, as will be described below, a non-uniform target erosion pattern improves the uniformity of the sputtered film.

Another sputtering source having a heart-shaped magnet arrangement is described in Japanese Patent Application Publication (Kokai) No. 62-211,375 entitled "Sputtering Apparatus", published Sept. 17, 1987. That patent prescribes the use of a heart-shaped closed loop magnet having a curve defined by the equation $r = 1 - a + 2a|\theta|/\pi$, (for $-\pi 23 \; \theta \leq \pi$); where the center of the sputter target is located at the origin of a polar coordinate system, r is the distance between the origin and a point on the curve defining the magnet centerline, l is the distance between the center of the heart and the cusp of the heart, and a is the distance between the center of the heart and the center of the target. No derivation is given as to how the inventors arrived at this equation, and it appears to be a compromise between the annular-shaped magnet of the '643 patent and the heart-shaped magnet of the '764 patent. As discussed in the '375 application, a magnet having the prescribed curve will not produce uniform erosion. Moreover, the '375 application does not teach how to obtain any arbitrarily selected erosion profile.

U.S. Pat. No. 4,995,958, entitled "Sputtering Apparatus With A Rotating Magnet Array Having A Geometry For Specified Target Erosion Profile", issued Feb. 26, 1991, to Anderson, et al., also assigned to the assignee of the present invention, describes another generally heart-shaped, closed-loop magnet array for use in a planar magnetron sputtering source. The Anderson, et al., patent, which is hereby incorporated by reference, includes a rigorous mathematical analysis to show how to construct a closed-loop rotating magnet to realize a predetermined erosion profile to thereby achieve, for example, highly efficient target material utilization and high deposition rates. It is noted that the invention of the '958 patent is readily adapted to use in a VersaMag ™ sputtering source.

Among other things, the '958 patent describes the shortcomings of the aforementioned Suzuki, et al., patent and the teaching of the '375 Japanese patent application, showing how each reference fails to provide a teaching which truly enables one to obtain uniform erosion of a planar sputter target. Importantly, FIGS. 12A–12E of the '958 patent, and the related text, clearly show that minor changes in the shape of a heart-shaped magnet may lead to very dramatic differences in the resulting erosion pattern of the sputter target. (It is believed that this is also shown by the '375 application.) Given the demonstrated fact that minor perturbations of the shape of a heart-shaped magnet may cause significant changes in the resulting target erosion profile, it becomes quite difficult to optimize the shape empirically. Thus, Anderson, et al.'s, mathematical analysis is a highly significant teaching in making heart-shaped, closed-loop magnets practically useful.

A closed-loop magnet configuration of the type described in the '958 patent has the additional advantage of being easily adjustable so that the shape of the magnet array, and therefore the characteristics of the sputtering source, can be changed without great difficulty or expense. As described in that patent, a plurality of magnets are held in position by two iron keepers, or pole pieces, which define the shape of the closed loop. Replacement and/or adjustment of the iron keepers to provide a different closed-loop configuration is a relatively simple matter. In this manner it is possible to use one source for different purposes, or to adjust the source as needs change.

A prime objective of the closed-loop rotating magnet of the '958 patent was to achieve better target utilization efficiency, normally an important objective given the high cost of sputter targets, and to achieve high deposition rates, another important factor due to the demand for ever greater system "throughput". As noted above, the need for greater sputtered film uniformity generally outweighs the need for efficient target utilization and deposition rate. Accordingly, the Anderson, et al., patent provides the basis for obtaining any arbitrary target erosion profile. It is noted, however, that the Anderson et al., patent provides no instruction as to how to determine what erosion profile to use under a given set of conditions to maximize sputtered film uniformity or other sputtered film characteristics.

As described therein, the mathematical analysis provided by Anderson, et al., is inapplicable at two areas of the heart, i.e., in the area near the "tip" of the heart, which is defined herein to mean the generally convex portion of the loop farthest away from the axis of rotation, and in the area near the "cusp" of the heart, which is defined herein to mean the generally concave portion nearest the axis of rotation and which lies between the two lobe-shaped portions of the heart. As a result of the inapplicability of the Anderson, et al., teaching to the region of the cusp of the heart, the designs they show leave the very center of the target unused, and are not optimized for best utilization of the sputter target edge. Moreover, the analysis of the '958 patent is based on the assumption that the magnet has uniform strength at all point along the loop, i.e., the sputtering intensity is the same at all points. In other words, the total quantity of material sputtered per unit length of the magnet is a constant. It has been observed that this assumption is not correct.

It is noted that all of the heart-shaped designs shown by Anderson, et al., Suzuki, et al., and the '375 application are symmetrical about a line which passes through the tip, the cusp, and the axis of rotation of the heart. The symmetry of the Anderson, et al., designs is due to the fact that their method of generating a heart-shaped magnet is by forming a spiral-like shape over 180° (i.e., over one half of a polar coordinate system) and then mirroring this shape to close the loop over the remaining 180°. However, as used herein, the term heart-shaped does not require that there be two strictly symmetrical halves. As will be described below, there may be circumstances when an asymmetrical heart-shaped magnet is desired. Likewise, as used herein, the term heart-shaped, does not require that the heart have a noticeable "tip". It has been found that there are advantages to using a design wherein the region farthest from the axis of rotation and generally opposite the cusp forms an arc of a circle. As used herein, the term "heart" implies that there is a cusp-like transition between two lobes. The cusp-like transition may be smoothed for design convenience.

Finally, it has been discovered that there are discrepancies between the position of the magnetic field adjacent to the sputter target surface as predicated by Anderson, et al., and as empirically measured. As noted above, even minor changes in the shape of the magnetic field generated by a heart-shaped magnet may result in significant variations in the erosion profile obtained.

SUMMARY OF THE INVENTION

Accordingly, it is an object of the present invention to improve and extend the teachings of the Anderson, et al., patent to obtain better sputtered film characteristics and better utilization of the target in a sputter source when using a generally heart-shaped, closed-loop rotating magnet array in a planar magnetron sputtering device.

Another object of the present invention is to provide a method for defining the shape of a heart-shaped, closed-loop rotating magnet array used in a planar magnetron sputtering system so as to produce a desired sputter target erosion profile at positions that are nearest and farthest from the axis of rotation of the magnet array.

Still another object of the present invention is to provide a method for determining the erosion profile on a sputter target which results in desired sputtered film characteristics, such as a desired level of uniformity, on a wafer being coated by sputtering.

Yet another object of the present invention is to provide a method for determining the shape of a generally heart-shaped, closed-loop rotating magnet for producing a desired erosion profile in a sputter target that takes into account variations between the predicted position of the magnetic field and the measured position of the corresponding static erosion track.

Another object of the present invention is to provide a method for designing a generally heart-shaped, closed-loop rotating magnet for producing a desired erosion profile in a sputter target, which is not symmetrical.

These and other objects of the present invention that will be apparent to those skilled in the art upon reading this specification are realized by a method and apparatus for providing a closed-loop rotating magnet array for use in a sputtering source having a planar target. In one aspect of the present invention, the method of determining the shape of the magnet is determined by starting with a heart-shaped magnet array, preferably one which is believed to be close to the desired shape. A magnet array having this starting shape is placed in a sputtering system and sputtering is performed while holding the magnet stationary. A static erosion profile is generated in this manner. The relationship between the location of this static erosion profile and the magnet centerline is mapped and this information is used to adjust the shape of the magnet so that a desired erosion profile is obtained.

By using the foregoing method it is possible to construct a magnet that results in a predetermined erosion profile on the surface of a planar magnetron sputtering target, where the static shape of the erosion profile differs from the shape of the underlying magnet and takes into account the discrepancy between the two.

In another aspect of the present invention, the desired shape of the erosion profile is established by determining a distribution function defining, to at least the first order, the angular distribution of atoms ejected from the sputter target under the operating conditions of the sputter source; determining the spacing between the surface of the sputter target and the substrate being coated; determining the sizes of the substrate and the sputter target and calculating the erosion profile that will result in uniform sputtered film deposition on the substrate.

DETAILED DESCRIPTION

Figure 1A:
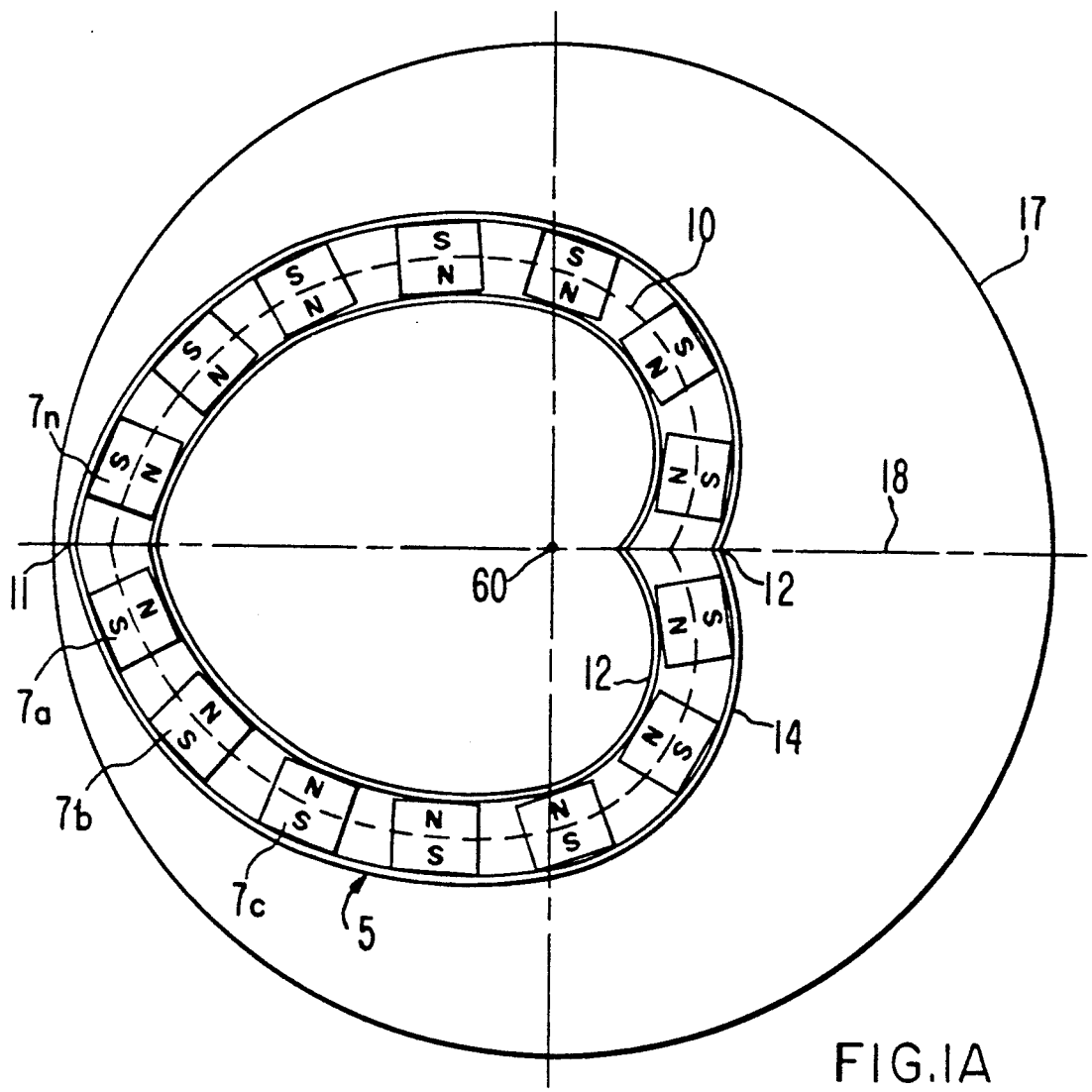
FIG. 1A is a schematic plan view of a prior art heart-shaped, closed-loop magnet array for use in a planar magnetron sputtering system built in accordance with the teachings of U.S. Pat. No. 4,995,958.

FIG. 1A is a schematic plan view of a prior art heart-shaped, closed-loop magnet array 5, comprising a plurality of individual permanent magnets 7a, 7b, 7c . . . 7n, for use in a planar magnetron sputtering system, built in accordance with the teachings of U.S. Pat. No. 4,995,958. As taught by the '958 patent, the centerline 10 of magnet array 5 lies on a curve defined by the equation:

$$\theta = \int_1^r \frac{\sqrt{\xi^2(u)u^2 - 1}}{u} du + C$$

where $\xi(u)$ is a function defining a preselected erosion profile and C is a selected constant.

As described in the '958 patent, each of the magnets 7i is uniformly disposed on a centerline 10, which lies between spaced apart inner and outer iron keepers 12 and 14, respectively. The spacing between inner and outer keepers 12 and 14 is uniform at all points except in the vicinity of the tip 11 and the cusp 12 of the heart. Iron keepers 12 and 14 are 1/16" thick in accordance with a preferred embodiment of the present invention. Magnet array 5 is mounted on plate 17 which is connected to means (not shown) for rotating it about an axis of rotation 60.

While the preferred embodiment is described in connection with a magnet array of the type depicted in FIG. 1A having iron keepers which serve as pole pieces, it will be recognized by those skilled in the art that other magnet arrangements are possible. For example, segmented magnets of the type shown and described in the aforementioned Suzuki, et al., patent will be recognized as being equivalent. A segmented magnet array offers the advantage of being easier to adjust from one configuration to another and, if desired, fine tune.

Figure 1B:
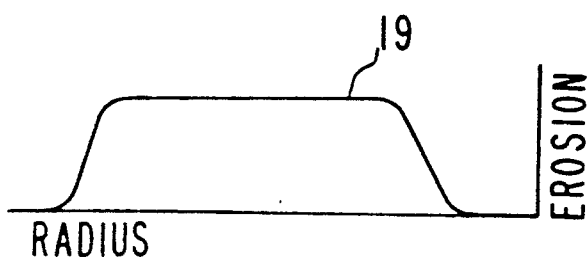
FIG. 1B is a depiction of the calculated erosion profile for the FIG. 1A magnet array.

FIG. 1B shows the theoretically calculated erosion profile 19 for the FIG. 1A magnet array 5. In other words, centerline 10 of magnet array 5 is laid out, per the above equation, to produce the erosion profile 19 shown in FIG. 1B. Stated equivalently, in FIG. 1B the function $\xi(u)$ is a constant so as to produce uniform erosion between the limits of integration. It is noted, however, that for $r \leq 1$ the equation is not solvable. Accordingly, when the centerline 10 of magnet array 5 is laid out in accordance with the teachings of the '958 patent, there is little or no erosion of the center of the target, as shown in FIG. 1B.

Various other heart-shaped, closed-loop magnet shapes designed to theoretically produce different sputter target erosion profiles wherein the function $\xi(u)$ is not a constant are shown in FIGS. 12A–12E of the aforementioned '958 patent. It will be noted from an inspection of these figures, and the accompanying text, that minor variations in the shape of a heart-shaped magnet will produce significant differences in the shape of the resulting target erosion profile. It follows that, while use of a properly configured rotating heart-shaped, closed-loop magnet in connection with a planar magnetron sputtering device ca result in improved target erosion uniformity, it is not obvious how to empirically arrive at the proper shape necessary to produce any arbitrary erosion profile.

Each of the heart-shaped magnet arrays shown in the '958 patent, or in any of the other prior art of which the inventor is aware, is symmetrical about a line 18 which runs though the tip 11, the cusp 12 and the axis of rotation 60 of the magnet. Moreover, each of the prior-art magnets is "pointed" at its tip 11; in other words the centerline is not smooth at the point the curve is reflected, i.e., the derivative of the centerline is discontinuous at this point.

EPC Patent Application Serial No. 91-300565.8, published Jan. 15, 1992, (hereinafter the '565 application) also assigned to the assignee of the present invention, describes magnet configurations based on the teachings of the '958 patent but extended to correct for the limitations of the '958 patent so that uniform erosion may be obtained in the center region of the target.

Figure 2:
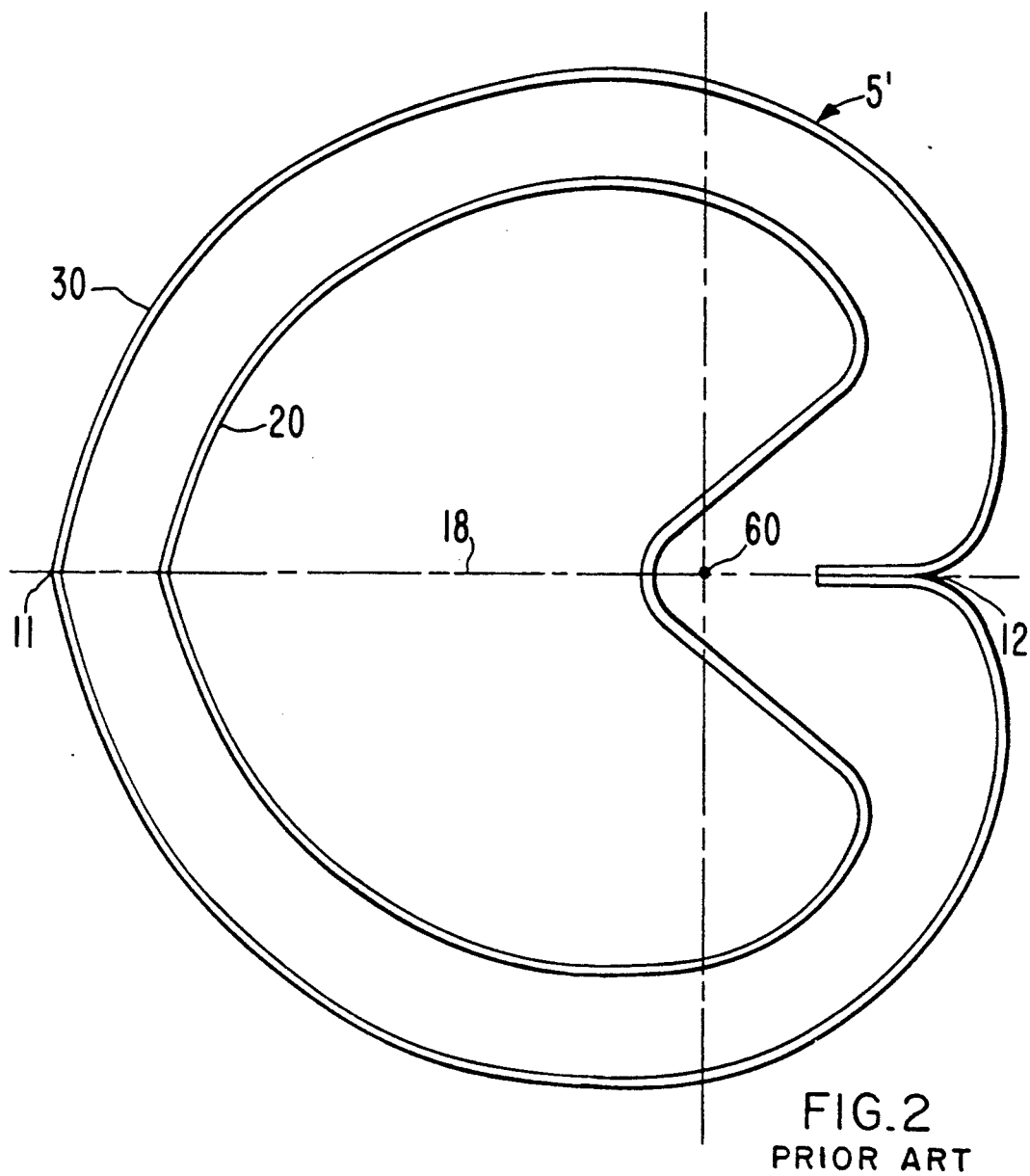
FIG. 2 is a schematic plan view of a prior art heart-shaped, closed-loop, magnet array for use in a planar magnetron sputtering system that has been sold commercially by the assignee of the present invention.

FIG. 2 is a schematic plan view of a prior art heart-shaped, closed-loop magnet array 5' for use in a planar magnetron sputtering system, that has been sold commercially by the assignee of the present invention under the trademark "Quantum S TM". For clarity the magnets within the array have been omitted and only inner and outer iron keepers 20 and 30 are shown. A plurality of individual permanent magnets is distributed between the iron keepers in a manner to similar to what is shown in FIG. 1.

The magnet array 5' of FIG. 2 is based on the teachings of the '958 patent as extended by the '565 application. In contrast to the heart-shaped designs of the '958 patent, the design of FIG. 2 includes magnets positioned in the vicinity of the axis of rotation 60 of magnet array 5'. In the FIG. 2 embodiment, the placement of the magnets near the axis of rotation is not strictly based on the teachings of the '565 application but also includes a combination of designer intuition and empirical results. It is noted that near the lobes and cusp 12 of the heart the iron keepers are not evenly spaced, and the departure from uniform spacing of the keepers in the vicinity of cusp 12 is far greater than the slight departure present in the FIG. 1A embodiment. The lack of uniform spacing makes placement of the magnets more difficult in this vicinity. Moreover, as described in the '565 application, the magnets in the central region may be different in strength.

While the magnet design of FIG. 2 represents an improvement over the design of FIG. 1A, insofar as it produces better target utilization near the center of the sputter target, the mathematical analysis that is required is cumbersome, making it difficult to obtain predictable control over the sputtering from the center with changes in the design. In addition, it has been determined that neither the FIG. 1A nor the FIG. 2 design precisely results in the erosion profile predicted by the teachings of the '958 patent or of the '565 application respectively.

Figure 3A:
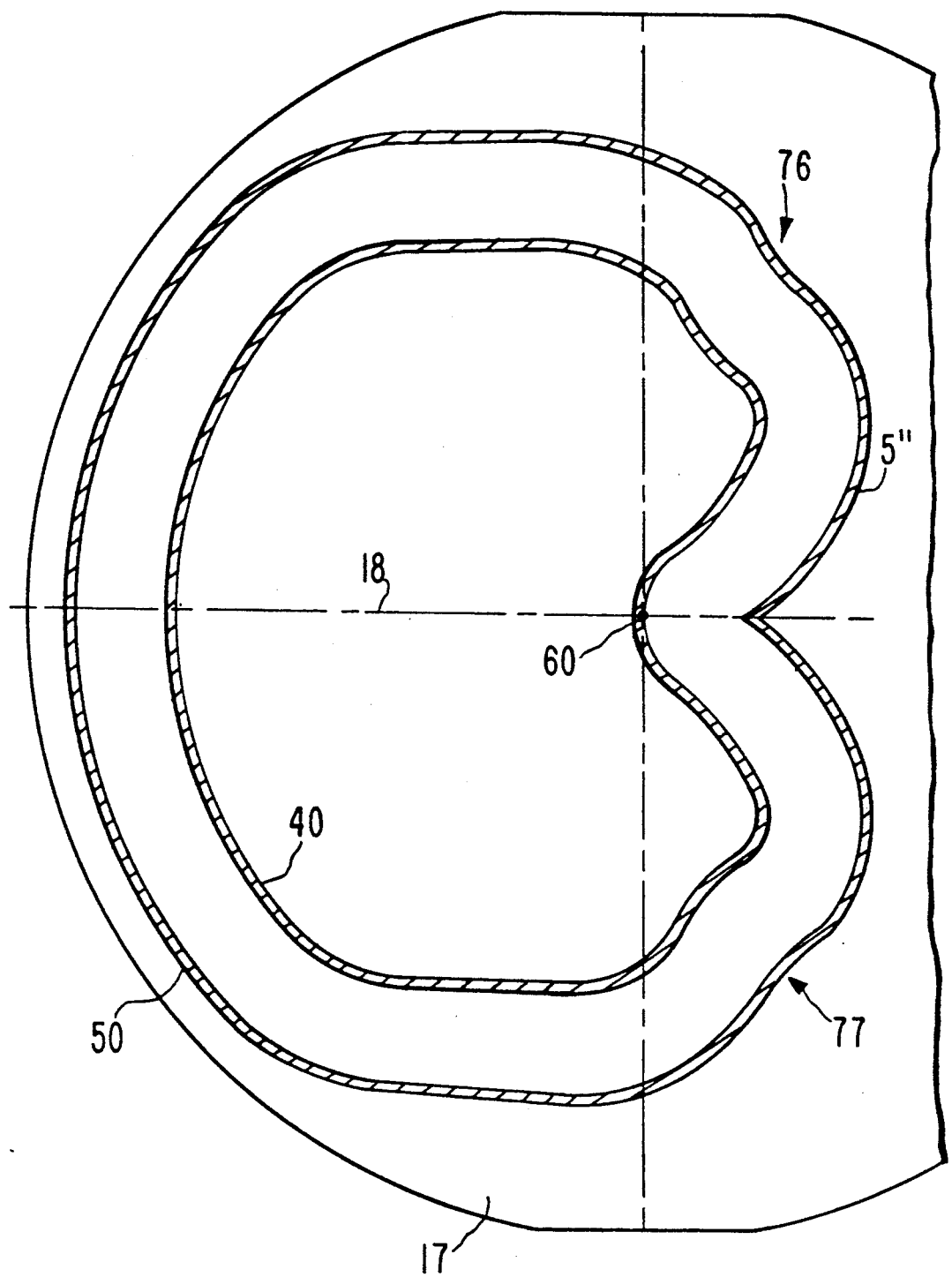
FIG. 3A is a schematic plan view of a heart-shaped, closed-loop, magnet array for use in a planar magnetron sputtering system built according to the present invention.

FIG. 3A is a schematic plan view of one embodiment of a heart-shaped, closed-loop magnet array 5" for use in a planar magnetron sputtering system built according to the present invention. Again, in the interest of clarity, the individual magnets which comprise the array are not shown. Rather, only inner and outer iron keepers 40 and 50 are shown in relation to the axis of rotation 60 and the plate 17 that magnet array 5" is mounted on.

Before describing the method used to arrive at the shape of the FIG. 3A magnet array 5", a description of its shape vis-a-vis the prior art is given. Starting at cusp 12 of the heart, it is noted that inner keeper 40 crosses the axis of rotation 60 of the magnet array, as in the FIG. 2 embodiment, while maintaining nearly even spacing between inner and outer keepers 40 and 50 in the vicinity of the cusp. Thus, this portion of the magnet achieves the benefits of the FIG. 2 embodiment, without sacrificing the benefits of maintaining uniformly spaced keepers, and without the design complexities of other embodiments shown in the '565 application.

It will also be noted that, just beyond the lobes of the heart, the shape of the magnet array has two inward inflections 76 and 77. In other words, while the shape of the prior art heart-shaped magnets all are such that the curve is at all points convex in relation to the interior of the loop, in the embodiment of FIG. 3A, there are two portions of the curve, 76 and 77, that are concave in relation to the interior of the loop.

Finally, it should be noted that the FIG. 3A embodiment has no "tip". While the FIG. 3A embodiment is symmetrical about line 18 running through cusp 12 and axis of rotation 60 of the heart, the portion of the curve that is farthest away from axis of rotation 60, and which lies on either side of the axis of symmetry 18, lies on an arc of a circle. Accordingly, the curve at this point is smooth, i.e., the derivative of the curve is continuous at this point. Moreover, in the FIG. 3A embodiment, a major portion of the heart, perhaps as much as one-forth or more of the curve, lies on this arc.

Figure 4:
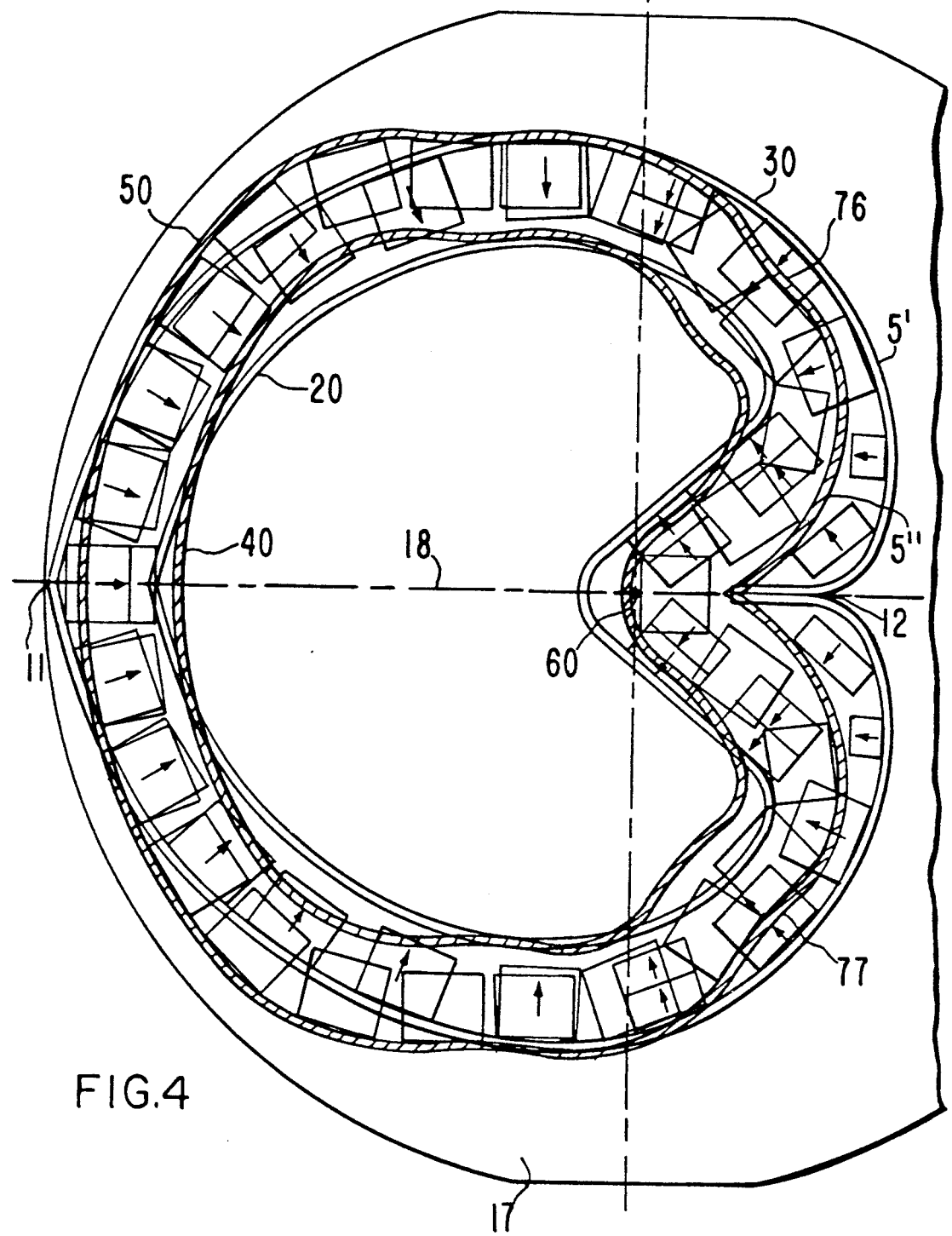
FIG. 4 is a schematic plan view showing the prior art magnet array of FIG. 2 overlying the FIG. 3 magnet array.

FIG. 4 shows the magnet array of FIGS. 2 and 3A in juxtaposition, so that the differences in shape may be more clearly seen. While the overall shapes appear to be quite different, the departure is not great at any given point around the loop.

Figure 3B:
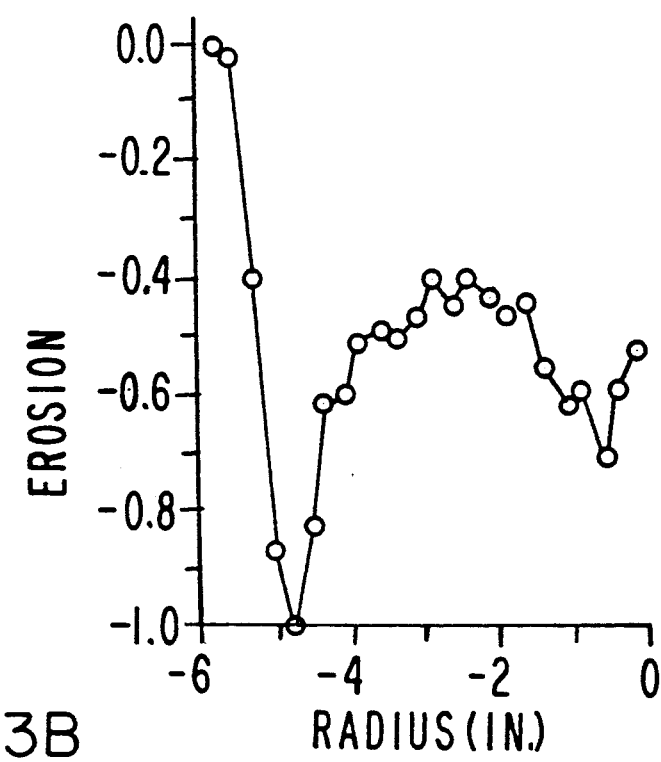
FIGS. 3B and 3C are a calculated target erosion profile and a measured target erosion profile, respectively, for the magnet shown in FIG. 3A.
Figure 3C:
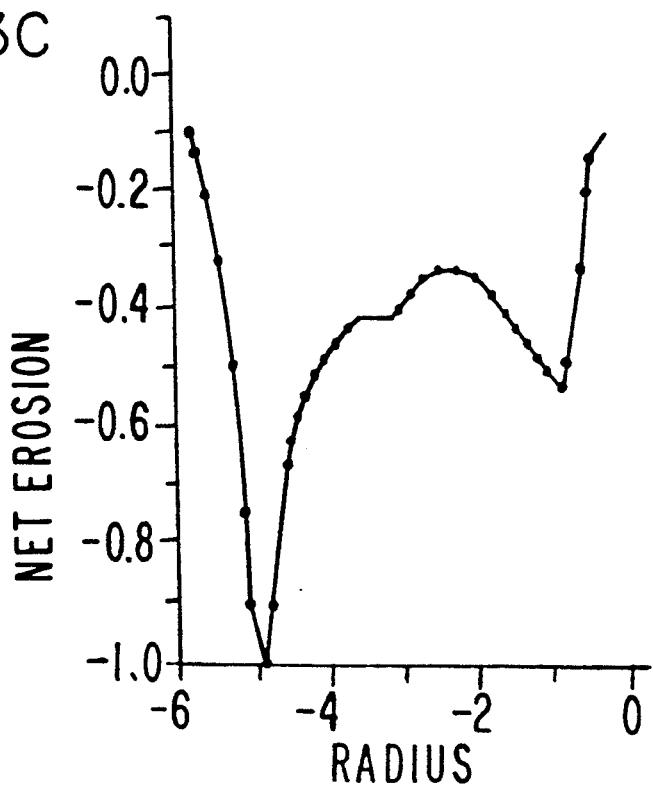

FIGS. 3B and 3C show the calculated and observed target erosion profile, respectively, for the magnet of FIG. 3A when used with a titanium target. Note that the two curves are nearly identical, except in the center region, where the actual erosion was greater than calculated. This discrepancy at the center may be related to the fact that the actual position of the magnet differed slightly from the position used to make the calculated erosion profile. It also may reflect the relative paucity of measured static erosion data points near the very center of the target. In arriving at the magnet configuration of FIG. 3A it was determined that a non-uniform target erosion profile would produce the best uniformity of sputtered film.

The method by which the shape of the magnet array depicted in FIG. 3A, and by which other shapes can be constructed to produce a selected erosion profile, will now be described. An initial heart-shaped, closed-loop magnet array is first constructed. In the preferred manner of performing the method of the present invention, the initial closed-loop magnet may either be constructed in accordance with the principles described in the '958 patent or in the manner used to create the Quantum S ™ magnet, so that a desired erosion profile will be approximated by the initial magnet shape. It is also possible to start with other heart-shaped designs, including those known in the prior art.

This initial magnet array is then placed in a sputtering system and the system is operated while holding the magnet array stationary to generate a static erosion groove in the surface of the sputter target. When performing this step it is preferred that the sputter target be constructed of the material which will be used with the magnet array being designed, and that the operating parameters of the system coincide with the actual operating parameters that will be used by the system in production. For reasons that are not fully understood, it has been observed that the static erosion profile produced by a given magnet array will differ slightly depending upon the material that is being sputtered.

As is to be expected, the resulting static erosion groove is also heart-shaped and forms a closed loop. Moreover, as expected from the prior art of planar magnetron sputtering using a stationary magnet array, any given cross section of the erosion groove around the loop has a valley-like appearance having a bottom region where erosion is greatest. However, for reasons that are not fully understood, the bottom of the erosion groove does not overlie the centerline of the magnet array. This discrepancy between the bottom of the erosion groove and the centerline of the magnet array, if not corrected or compensated for, will produce results that vary from the teachings of the '958 patent.

An important premise of the '958 patent is that the region of greatest target erosion directly overlies the centerline of the magnet array. This premise is based upon the assumption that the magnetic field intensity adjacent to the target surface is greatest directly over the magnet centerline. It has now been empirically observed by the inventor that this premise is not fully accurate. As noted above, minor changes in the configuration of a heart-shaped, closed-loop magnet array can result in significant changes in the erosion profile produced by the magnet array. The discrepancy between the shape of the magnet array and the erosion profile it produces during static sputtering can be thought of as meaning that the magnet array being used has a different effective shape than is intended. This problem is not recognized in the '958 patent, nor does the '958 patent teach how to compensate for the discrepancy to produce a magnet with the proper effective shape.

After a static erosion groove is made, the shape of the groove is carefully measured at a finite number of points around the groove and a plot is generated showing the mathematical relationship between position and depth of target erosion. In the preferred way of implementing the method of the present invention, these measurements are made in polar coordinates. For example, at a finite number of values of R, (R being the radial distance from the axis of rotation 60 of the magnet array 5,) the depth of target erosion is measured as a function of $\theta$.

Figure 5A:
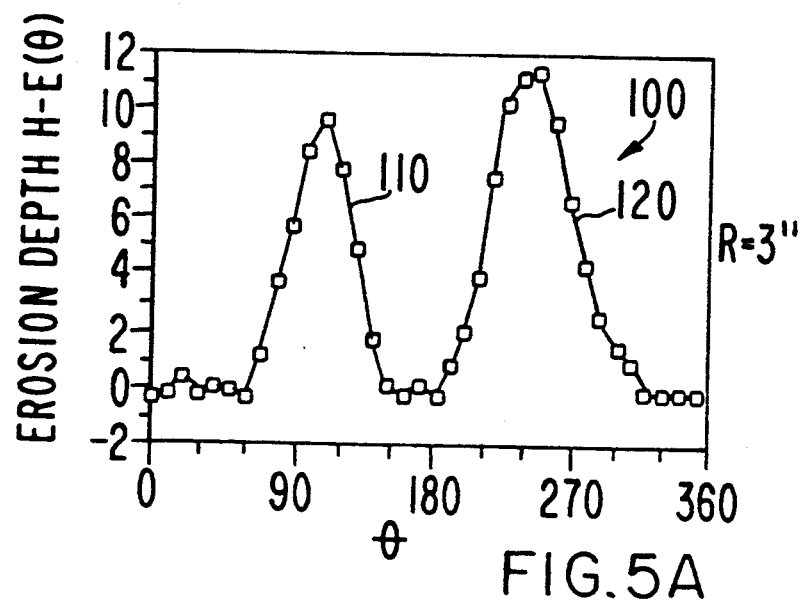
FIGS. 5A is a sample plot graphically showing a static target erosion profile at a given radius measured in connection with the method of the present invention.

An example of a plot created in this manner is shown in FIG. 5A. In FIG. 5A the horizontal axis is the angle $\theta$ and the vertical axis is the depth of erosion, $E(\theta)$. For $R = K_i$, where $K_i$ is a given value of distance from the center of the coordinate system, i.e., the axis of rotation, it is seen that a typical erosion profile 100 includes two regions of erosion 110 and 120 as one rotates from 0° to 360°. A set of similar plots are then created for a finite number of values of $K_i$, for example, twenty such plots may be created, e.g., if the radius of the target is 5 inches, then plots could be created at each quarter inch interval between the origin and the edge of the target. The values of $K_i$ may be thought of as defining a set of concentric circles centered around the axis of rotation. The present technique does not require that the values of $K_i$ be evenly spaced. For example, one may select values of $K_i$ that correspond to the positions of the individual magnets in the array. In the example shown in FIG. 5A the selected value of $K_i$ is 3 inches.

Each of the static erosion plots that has been empirically created using this technique is then integrated over a revolution of the magnet to produce a value of erosion depth $E(R)$ for that particular value of $K_i$. The erosion depth values for each $K_i$ are then plotted to generate an overall erosion profile for the magnet when it is rotated. An example of a curve 130 generated by this method is shown in FIG. 5B. The integration required by this step may be performed using standard numerical integration techniques that are well-know to those skilled in the art. In the graph of FIG. 5B, the vertical axis is, again, the depth of erosion, E(R), while the horizontal axis is the radial position on the target surface relative to the origin, i.e., the axis of rotation. Point 140 represents the data point obtained from the plot of $K_i$ as shown in FIG. 5A, i.e., at R=3 inches. (Each of the calculated data points that comprise erosion profile 130 is represented by a solid square, and these points have been normalized to a maximum value of one.)

It has been found that the calculated erosion profile 130 of FIG. 5B conforms to the observed erosion profile generated when the magnet is rotated.

Figure 5C:
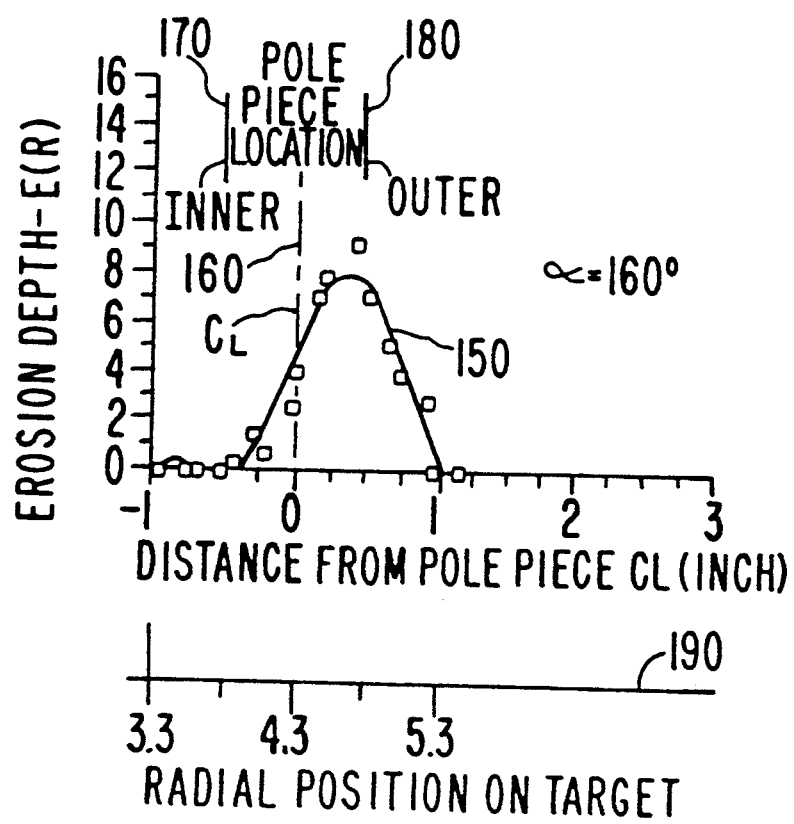
FIG. 5C is a sample plot of a static erosion profile at a given angle measured in connection with the method of the present invention.
Figure 5B:
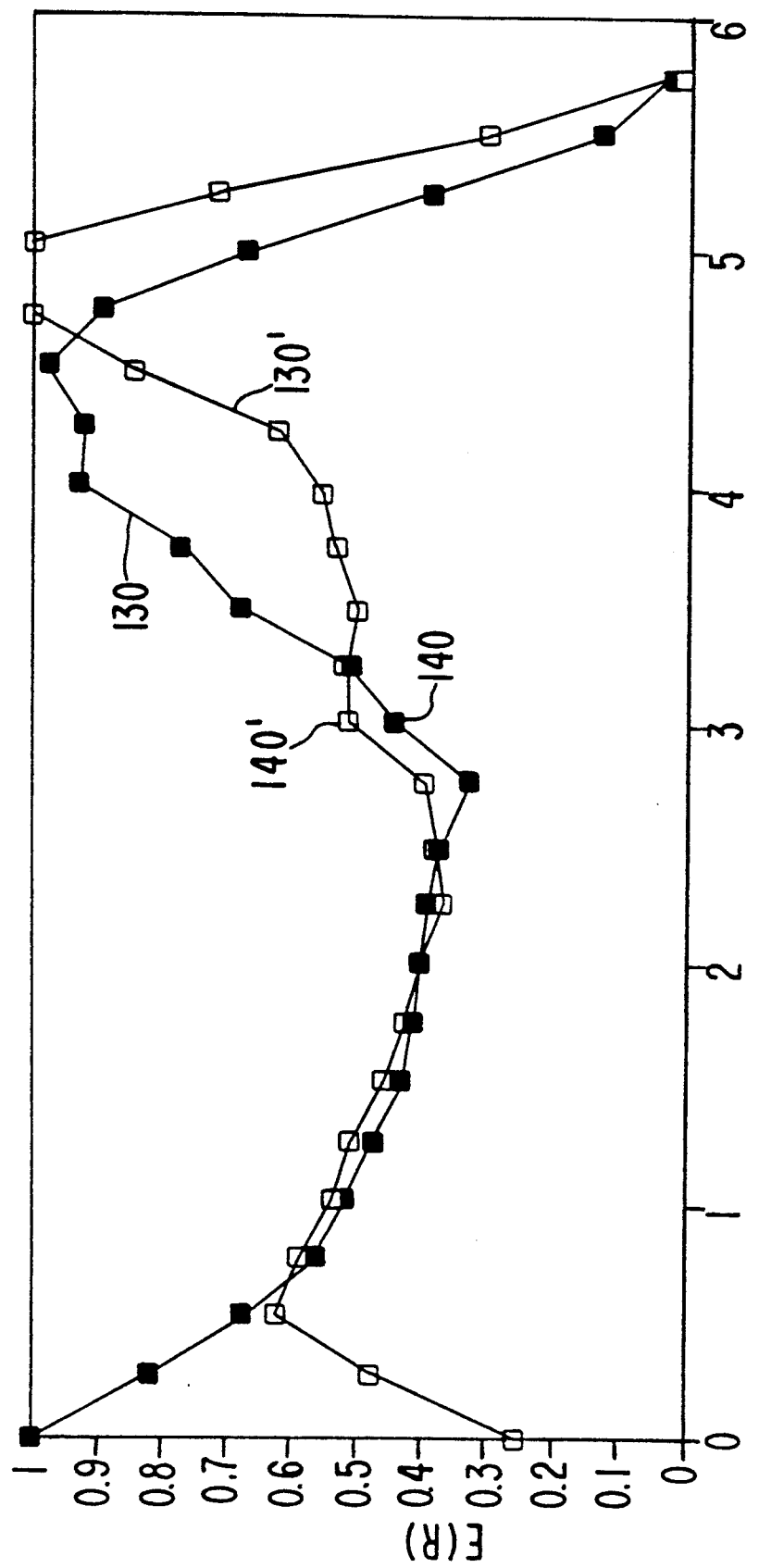
FIG. 5B is a sample calculated erosion profile generated from a set of plots of the type shown in FIG. 5A.

The static erosion data plotted to form the graph of FIG. 5A can be plotted in another manner, as is shown in FIG. 5C. Rather than plot the erosion depth at a certain radial distance as a function of angle, as in FIG. 5A, the erosion depth data can be plotted at a finite number of angles $\theta = \alpha_i$, as a function of distance, r. If the target in thought as being a wheel, the data points plotted on FIG. 5C may be thought of as the erosion profile taken along a "spoke" of the target, where each spoke is at an angle $\alpha_i$. In the example of FIG. 5C, $\alpha_i = 160°$. Again, the erosion profile shown in FIG. 5B can be generated from the data in the set of curves of FIG. 5C.

It will be apparent to those skilled in the art that the static erosion profile data of FIGS. 5A and 5C can equivalently be represented in a three-dimensional system or numerical array wherein a finite number of data points on the surface of the sputter target each has a set of values associated with the angular position $\theta$, the erosion depth $E(R, \theta)$, and the radial distance R of that point on the surface of the sputter target from the origin, i.e., the axis of rotation.

The curves of FIG. 5C have been conveniently used by the inventor in practicing the present invention to adjust the shape of the magnet array to correct for the discrepancy between the predicted erosion profile of the '958 patent and the static erosion profile observed. How this may be done will now be explained. On FIG. 5C the radial position of the centerline of the magnet array for $\theta = \alpha_i$ is shown at dashed line 160. The positions of inner and outer pole pieces, 170 and 180 respectively, are also shown. The discrepancy between the effective shape of the magnet and the actual shape is readily apparent from the offset between line 160 and the point of greatest erosion. For convenience, the position of the centerline of the magnet along the x-axis is arbitrarily defined to be at point x=0. (For illustrative purposes, an equivalent horizontal axis 190 is shown relating the erosion profile to the radial position on the target.) A fifth order polynomial is then derived, using known mathematical techniques, to fit the data points plotted in FIG. 5C. This fifth order polynomial is shown as curve 150.

It is assumed that a minor perturbation of the centerline of the magnet at a given $\alpha_i$ will not affect the shape of curve 150, nor will it affect the offset between magnet centerline 160 relative to curve 150. It is also assumed that a minor perturbation of the centerline of the magnet at a given $\alpha_i$ will not affect the shape or offset of curve 150 at any other value of $\alpha$. These assumptions are quite reasonable if the displacement of the magnet at each $\alpha$ is small. In order that these assumptions remain valid, it is best to start with an initial magnet shape which is expected to be close to what the final shape will be, so that the perturbations of the positions of the individual magnets remain small. However, if the perturbations grow too large, the technique described herein may be done on an iterative basis.

The effect of making minor adjustments to the position of the magnet centerline at selected values of $\alpha_i$ can readily be translated into a revised, calculated erosion profile that reflects the adjustments that have been made. For example, erosion profile 130' in FIG. 5B is shown to reflect the adjustment of several of the magnet centerline in a number of positions. (Each of the calculated data points that comprise erosion profile 130' is shown as a hollow square.) It is thus possible to calculate the perturbations in the position of the magnet means at selected points that are needed to produce a preselected erosion profile on the surface of the target.

So long as the perturbations of the magnet positions are small enough that the assumptions described above remain reasonable, the technique that has been described is a very powerful tool for selecting a magnet shape that will produce a selected erosion profile. While based in principle on the teachings of the '958 patent, it will be seen that the technique of the present invention has several advantages over what is shown in the '958 patent. These advantages include:

(1) the ability of the present technique to obtain a magnet shape that will result in preselected erosion profile, accounting for the discrepancy between the actual and the effective shape of the magnet array;

(2) the ability of the present technique to predict and adjust the shape of the erosion profile in the vicinity of the cusp of the magnet, and in the vicinity of the magnet closest to the edge of the sputter target;

(3) the ability of the present technique to correct for variations in the erosion intensity over the length of the closed-loop; and, (4) the ability to make perturbations in the shape of the magnet to produce an asymmetrical heart-shaped design.

The use of an asymmetrical design allows greater "fine-tuning" of the magnet shape. In a symmetrical design, any magnet centerline adjustment in a region lying on one half of the magnet is doubled because the same adjustment is automatically made to the symmetrical half. Using the present technique, it is possible to adjust one half of the magnet in a predictable way while holding the other half unchanged. This is because the technique uses data taken over the full 360° of the coordinate system.

As noted, by making suitable adjustments to the centerline of the magnet, it is possible to produce a magnet that has an effective shape that is in accordance with the teachings of the '958 patent. In other words, it is possible to configure a magnet that produces a static erosion pattern on the surface of the target a portion of which conforms to the equation:

$$\theta = \int_1^r \frac{\sqrt{\xi^2(u)u^2 - 1}}{u} du + C$$

where $\xi(u)$ defines a preselected erosion profile and where the centerline of the magnet is displaced from the centerline of the static erosion groove to compensate for the discrepancy therebetween.

Having shown how to obtain a magnet having a shape that results in a predetermined erosion profile on the surface of the sputter target, we now turn to a discussion of how to determine what is the optimal erosion profile. While many of the prior art patents emphasize the desirability and importance of uniformly eroding the surface of the sputter target, uniformity of erosion is actually a secondary consideration to most users of sputtering systems. The primary consideration is the need to consistently obtain a sputtered film having desired characteristics, for example, uniformity, on the wafers being coated. An aspect of the present invention is a technique that may be used to calculate the target erosion profile that will result in a film having the desired characteristics at the surface of the wafer.

The present technique for predicting the uniformity of film deposition takes into account a number of variables that affect the rate at which sputtered material accumulates at any given point on the surface of the substrate. The important variables that enter into the technique of the present invention will now be discussed.

First, it is necessary to know the angular distribution of atoms ejected from the surface of the sputter target. It is frequently assumed, for the sake of simplicity, that sputtered atoms are ejected in a cosine distribution. This assumption is reasonable in the case of aluminum, the most commonly used sputtered film in semiconductor integrated circuit fabrication, where the atomic weight of the material ($Z=27$) is significantly less than the atomic weight of argon ($Z=40$) which is typically used as the sputtering gas. It known, however, that when sputtering higher atomic weight materials such as titanium ($Z=48$) or tungsten ($Z=184$), the angular distribution of sputtered atoms does not conform to a cosine distribution. Moreover, in some cases the crystalline structure of the sputter target material may also affect the angular distribution of sputtered atoms.

Figure 6B:
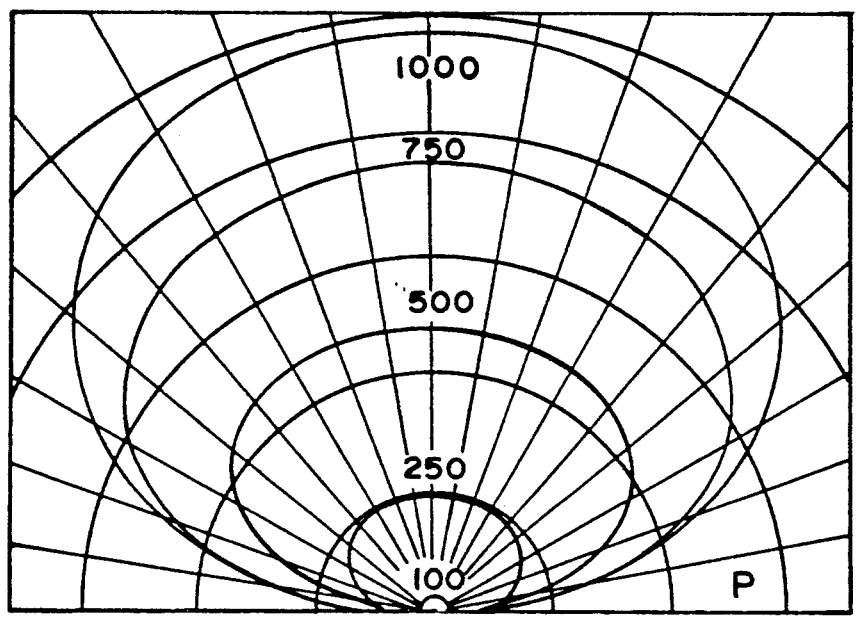
FIGS. 6A and 6B are graphs, in polar coordinates, showing the angular distribution of atoms of nickel and platinum, respectively, ejected from a surface by ion bombardment.
Figure 6A:
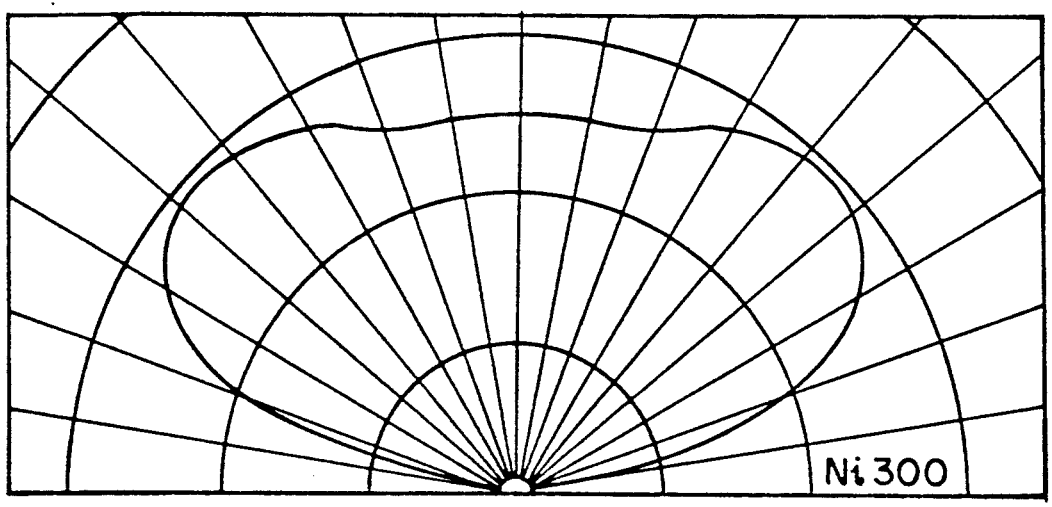

FIGS. 6A and 6B are plots, obtained from the scientific literature, showing the angular distribution of nickel ($Z=59$) and platinum ($Z=195$) atoms, respectively, ejected by bombardment with ions of mercury ($Z=201$). FIG. 6A clearly shows the influence of these factors in producing non-cosine distribution. This figure shows a major departure from a cosine distribution despite the fact that nickel has a much lower atomic weight than mercury. FIG. 6B shows the influence of the kinetic energy of the bombarding ions, i.e., as the ions become more energetic, the angular distribution increasingly approaches a cosine distribution. Conversely, it will be observed that at lower energies the distribution function has a "flatter" appearance, i.e., fewer of the ejected atoms leave at an angle that is nearly normal to the surface. This phenomenon may be explained by the fact that it takes more incident energy to cause an atom to be knocked loose in the normal direction than to knock it loose at a sharply acute angle.

Accordingly, the initial step in determining a desired erosion profile is to establish the angular distribution of the atoms being sputtered under the operating conditions that will be used in the system. If the requisite information is not available from the literature, this may be accomplished by empirical measurement using the material to be sputtered in a system operated under similar conditions. After the distribution is empirically determined, the data is then fit to a mathematical function which approximates, to at least the first order, the measured distribution. In the preferred method of the present invention, it has been found useful to approximate the empirical data by using a distribution function which is a power of the cosine function multiplied by a second function having an adjustable parameter, as set forth in the following:

$$\left[ \frac{(1+K_1)\left(\frac{\theta}{\pi}\right)^2}{K_2} \right](\cos\theta)^n$$

where $K_1$ is an adjustable parameter selected to fit the data and $K_2$ is a scaling factor.

The next parameter which needs to be understood before a calculation of a desired erosion profile may be made is the distance between the substrate and the sputter target. Normally, the distance between the sputter target surface and the wafer will be constant (ignoring the effects of target erosion), in a given system configuration. In most applications, it is desirable to space the substrate as close as possible to the sputter target to maximize the deposition rate and to minimize loss of target material. (From the foregoing discussion of the angular distribution of sputtered atoms, it should be apparent from the geometry that an atom which leaves the surface of the target at an acute angle has a greater chance of landing on the substrate if the substrate is closely spaced to the target. If a significant number of sputtered atoms do not land on the substrate, both the rate of film deposition will be lowered and the waste of sputtered material will be increased.)

On the other hand, close coupling of the target and the substrate makes it more difficult to obtain adequate sputtered film uniformity. It is sometimes preferable to interpose shields, shutters, collimators, etc., to enhance the sputtered film characteristics or to control the sputtering process, and the present magnet designs and methods are applicable where the source to substrate spacing is increased to accommodate such structures. As a practical matter, sputter sources having a wafer-to-target distance of 2 to 10 cm are now in use.

Another geometrical parameter that must be factored into the calculation of the desired erosion profile is the relative sizes of the sputter target and the wafer. If uniformly eroded, a target that is much larger than the substrate will result in considerable waste of sputtered material. On the other hand, if the target is similar in size or smaller than the wafer, it will be more difficult to achieve adequate deposited film uniformity. Such a configuration would also make it difficult to achieve adequate "step-coverage" in the deposited film, where step coverage is a well-known measure of the ability of the film to coat angled device features on the wafer surface. For example, close correspondence in size between the target and the wafer would result in a substantial difference in the ability of the sputtered film to cover angular features on the device depending on which way those features were facing. There would be a low flux of sputtered material arriving at the wafer at angles toward the perimeter and, thus, it is likely that outwardly facing features near the edge of the wafer would not receive an adequate coating of sputtered film. On the other hand, inwardly facing features at the same location would likely receive an adequate coating since the flux of material would be from angles corresponding to the center of the target.

Most modern integrated circuit devices are now being made on eight-inch diameter wafers, and a sputter target of the type used in the present invention has a diameter of 11.64 inches, i.e., the edge of the target extends almost two inches beyond the edge of the wafer.

Yet another parameter that should be considered in calculating the optimum sputter target erosion profile is the operating pressure of the sputtering system. While the sputtered atoms may leave the surface of the target with a certain angular distribution, collisions between gas molecules (or plasma ions) and sputtered atoms may alter the trajectories of the sputtered atoms before they reach the wafer surface. The scattering effects of gas collisions on the angular distribution of sputtered atoms reaching the surface of the wafer can be calculated. It has been found, in the context of the operating parameters used in the preferred embodiment of the present invention, that gas collisions may or may not be a significant factor depending upon the total pressure used during sputtering. The effects of gas scattering can be reduced with close coupling between the target and the substrate and low operating pressure of the sputtering system, i.e., 1 millitorr.

Thus, using the method of the present invention for determining the desired target erosion profile involves first determining the geometry of the system. In particular, knowledge of the target-to-substrate spacing and the diameters of the target and the substrate are required. Next, one defines a mathematical function which approximates, to at least the first order, the distribution of sputtered atoms leaving the surface of the sputter target at the operating conditions of the sputter source. Finally, if necessary, an adjustment is made to the distribution function to account for gas scattering effects.

With the foregoing information in hand, it is then possible to calculate a target erosion profile that will result in the application of a uniformly thick sputtered film on the surface of the wafer. The calculation is based on the fact that the erosion rate at a point on the surface of the target is a measure of the sputtering rate from that point. Such a calculation can be performed using a variety of computer modelling techniques of the type that are known in the art. It should be noted that there will be more that one erosion profile that will produce uniform sputtered film deposition. It is desirable to select an erosion profile which both produces a uniform film and, to the greatest extent possible, makes the best use of the target material, and low particulation by avoiding target areas of net build up.

Having arrived at a desired erosion profile in the foregoing manner, it is then possible to configure the magnet, in the manner described above, to obtain the desired erosion profile.

The technique of the present invention has, thus far, been described as two separate procedures, i.e., a procedure for calculating a desired erosion profile and a procedure for configuring a heart-shaped, closed loop magnet to obtain the desired erosion profile. These two procedures can be combined into a single method in which all of the necessary information is entered into a computer model. The effect on sputtered film uniformity due to minor perturbations in the position of the magnet centerline at one or more locations can then be directly calculated. One could use such a combined model to prescribe a suitable magnet configuration for a given set of parameters.

Figure 7A:
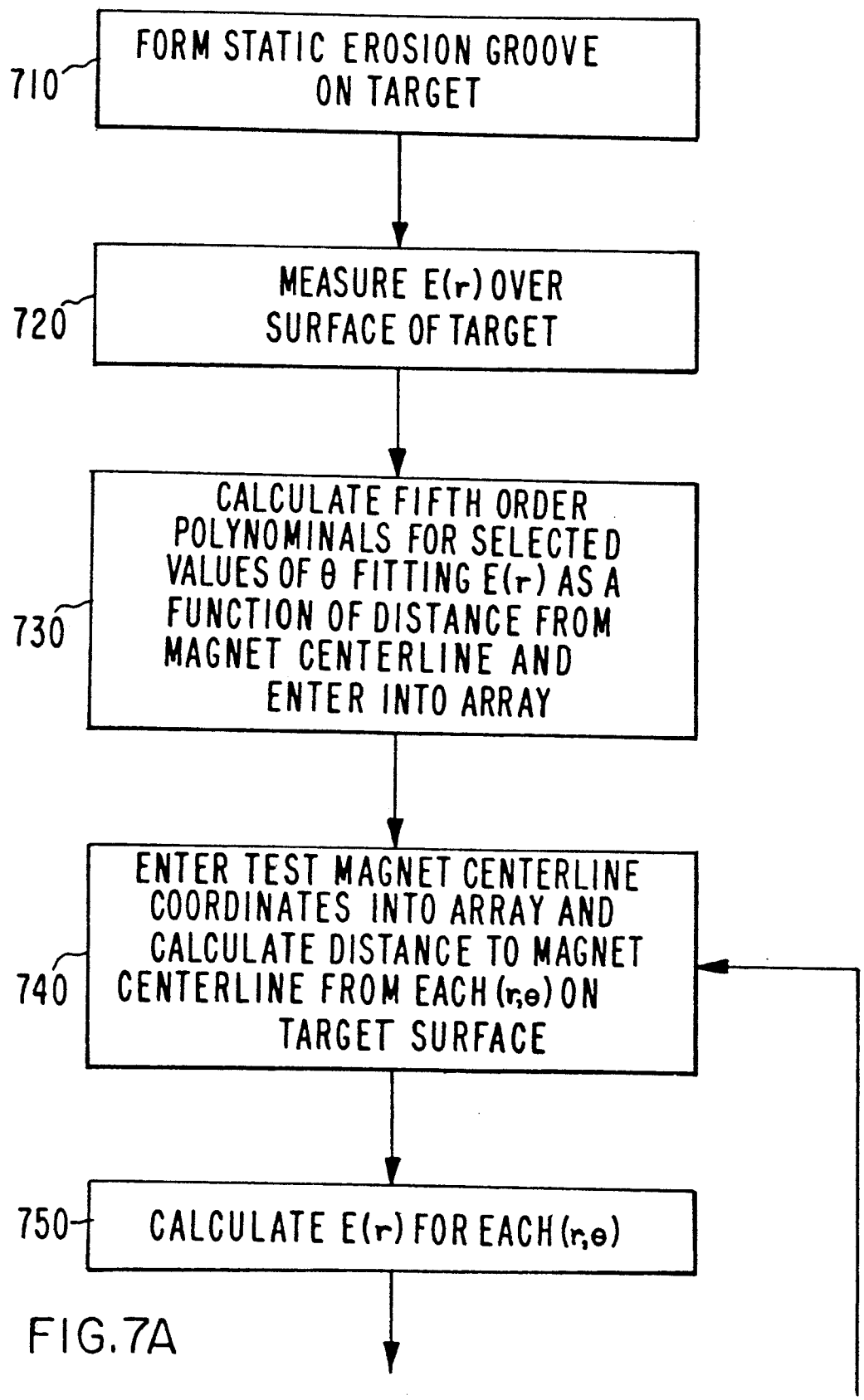
FIG. 7 is a flow chart of a preferred technique for practicing the method of the present invention.
Figure 7B:
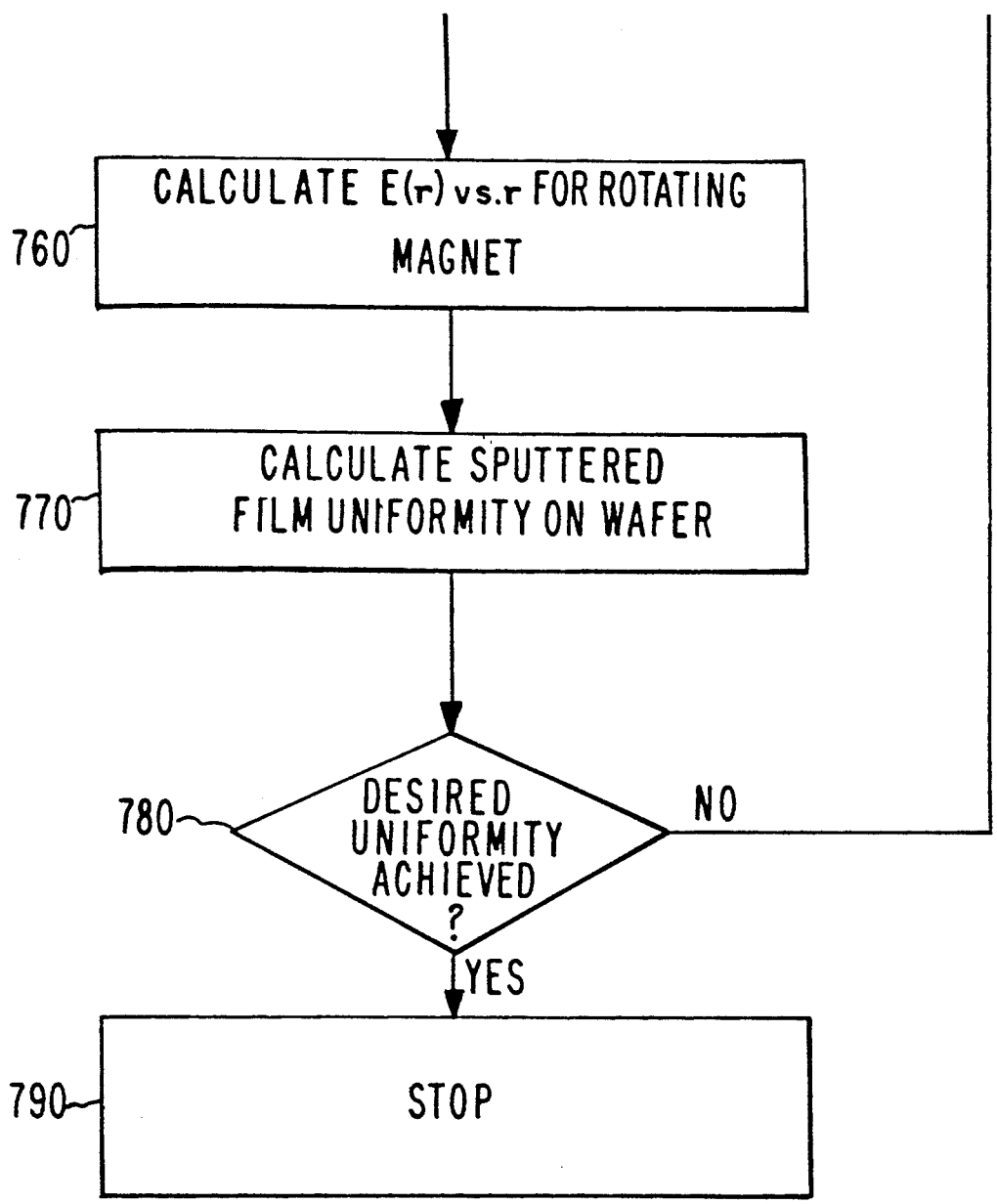

FIG. 7 shows a flow chart for practicing a preferred method of the present invention wherein the sputtered film uniformity is directly calculated with changes in magnet position. As described above, the first step 710 is to form a static erosion groove on the surface of the sputter target. The depth of target erosion is then measured 720 at a finite number of points (r, $\theta$) on the surface of the target. For selected values of $\theta$, fifth order polynomials are constructed 730 to fit the observed data, and the polynomials are entered into an array. For simplicity, the fifth-order polynomial for a particular $\theta$ is made relative to the centerline of the magnet used to generate the static erosion groove.

The coordinates of the centerline of a new magnet shape to be tested are then entered into an array 740 and the distance from each value of (r, $\theta$) used in the array to the new magnet centerline is calculated and entered into an array. Preferably, the position of the centerline of the new magnet does not vary significantly at any given location from the position of the centerline of the magnet used to form the static erosion groove. A static erosion depth calculation 750 is then made for each (r, $\theta$) based on the new magnet positions. The calculated static erosion depth information is then integrated over a revolution of the magnet to obtain a calculated erosion profile associated with the new magnet positions 760.

The uniformity of the sputtered film is then calculated 770, using the target erosion profile calculated in step 760. As describes above, the calculation of film uniformity should take into account the geometry of the sputtering system as well as the characteristics of the material being sputtered and any significant gas scattering effects. Calculation 770 involves a double integration so that the effects of the release of material at a given rate and at a given distribution from each point on the target is assessed for each point on the wafer. The double integration involves calculating, for each point on the surface of the wafer, the amount of material that will be deposited. This, in turn, involves integrating the flux from each point on the target both as a function of angular position and as a function of radial position. After the uniformity information is thus calculated, a judgment is made as to whether acceptable uniformity has been achieved, i.e., the calculated uniformity for each of the points on the wafer is compared to determine the variance in film thickness across the wafer surface. If acceptable film uniformity has been achieved, i.e., if the variance has been minimized, the method is complete and the magnet shape is constructed. If the film uniformity is not acceptable, or if it is thought that further improvement may be achieved, the magnet shape is further perturbed and entered at step 740 and the process is repeated again from that point.

A systematic approach to perturbing the magnet at step 740 that has been used by the inventor is as follows. Starting with the magnet shape that is used to form the static erosion groove of step 710, a new magnet is defined wherein the position of the magnet is changed at only one point, which may be at any selected value of $\theta$. After the sputtered film uniformity for this new magnet is calculated, the uniformity obtained is compared with the uniformity obtained by the prior magnet configuration. If the uniformity is improved, the same magnet position is further adjusted in the same direction and another uniformity calculation is made. If the uniformity is degraded, the magnet is moved in the opposite direction and a uniformity calculation is made per steps 740-780. The first magnet position is iteratively adjusted until no further improvement in uniformity is obtained. Thereafter, the next magnet position is adjusted and the same procedure is followed until no further adjustment of the second magnet produces improved uniformity. This process is repeated for all of the magnet positions in sequence, after which the entire process can be repeated as many times as is desired starting again at the first magnet position. This systematic approach lends itself quite well to automation, and can easily be implemented by a computer program. Other, equivalent, systematic approaches will be apparent to those skilled in the art. For example, one might limit the adjustments of any given magnet position to a set number during each "loop" around the magnet.

Up until now, the method of the present invention has been described solely in the context measuring a static erosion groove to determine the "effective" magnet shape. While this is the preferred manner of implementing the present invention, other methods are possible. For example, it is possible to measure the "effective" magnet position by observing the position and intensity of the plasma created by a starting magnet. Modern techniques allow one to accurately measure the plasma intensity at a finite number of preselected points over the target, and this information could be used as a substitute for the information obtained from measurement of a static erosion groove. It is believed, however, the plasma intensity information would not be as accurate and is, therefore, less preferred.

While the flow chart of FIG. 7 has been described solely in the context of sputtered film uniformity, other sputtered film characteristics can also be taken into account. For example, step 770 could, instead, involve a calculation of the step coverage produced by the new magnet configuration or of the via-filling properties. While the present techniques for via-filling involve steps which go beyond simple sputtering, the ability to deposit a suitably thick layer of film at the bottom of the via is an important aspect of the process. It should be apparent from geometrical considerations that the ability to fill the bottom of a narrow via is related to the angular distribution of the atoms of sputtered material striking the surface of the wafer. Thus, sputtered atoms which are incident at the wafer surface in a substantially perpendicular direction are likely to reach the bottom of a via, whereas atoms which are incident at a sharp angle will be intercepted by a wall of the via before reaching the bottom.

Likewise, more than one film characteristic can be calculated, with the goal of optimizing the balance between them. For example, improved uniformity caused by a particular magnet perturbation may be offset by degraded step coverage.

While the present invention has, thus far, been described solely in the context of a heart-shaped planar magnetron sputter source, it should be apparent to those skilled in the art that the methodology described herein is equally applicable to other magnet designs intended to produce a predetermine erosion profile in the surface of a sputter target. For example, the teachings of the '958 patent are not limited to heart-shaped magnet arrays, and several non-heart-shaped magnet array configurations are disclosed. To the extent there is a similar discrepancy between the actual and the effective shape of a magnet array built in accordance with one of the other embodiments, i.e., the static erosion groove does not overlie the magnet centerline, the methodology taught herein can be used to adjust the positions of the individual magnets in the array to achieve a desired effective magnet shape and a desired erosion profile. Likewise, according to the present invention, by appropriate computer modelling, the effect on sputtered film uniformity caused by adjustments in the positions of the individual magnet positions can be directly determined.

U.S. patent application No. 471,898, abandoned, which is a continuation-in-part of the '958 patent, and which is hereby incorporated by reference, extends the teachings of the '958 patent so that magnet arrays can be constructed for use with non-planar sputter target surfaces to produce arbitrarily selected erosion profiles. A condition required by the '898 application is that the sputter target surface be a surface of revolution. The '898 application teaches that the centerline of the closed loop magnet array should lie on a curve defined by:

$$\theta = \int_1^r \sqrt{1 + \left(\frac{dz}{dr}\right)^2} \cdot \sqrt{r^2 \xi(r)^2 + 1} \; \frac{dr}{r} + C$$

where $\xi(u)$ is a preselected erosion profile to be generated in the curved target when the magnet is rotated and sputtering is performed, $z(r)$ is a surface of revolution defining the surface of the sputter target, and C is a selected constant.

Like the '958 patent, a premise of the '898 application is that the magnetic field intensity adjacent to the target surface is greatest directly above the centerline of the magnet array so that the shape of a static erosion groove would conform to the shape of the magnet. Again, it will be apparent to those skilled in the art that the methodology of the present application can be applied to magnets configured in accordance with the '898 application to compensate for discrepancies between the actual and effective magnet array shapes.

While the above description has been directed to the preferred embodiments set forth herein, such is intended to be exemplary and not limiting. Many variations and substitutions will be obvious to those skilled in the art in view of the foregoing disclosure. Accordingly, it is intended that the scope of the patent be limited only by the following claims.

I claim:

1. A magnetron sputtering source for depositing a thin film layer on a substrate comprising:
    a target having a face from which material is sputtered,
    rotatable magnet means having a magnetic array and its centerline positioned behind said target and generally conforming to the shape of said target, said rotatable magnet means having a shape such that when said magnet means is held stationary it produces a static erosion pattern which is offset from the centerline of the magnet array and said static erosion pattern having a groove a substantial portion of which lies on a curve selected to produce a desired erosion pattern in the surface of the sputter target when said magnet means is rotated.

2. The magnetron sputtering source of claim 1 wherein said sputter target is planar and said curve is defined by $$\theta = \int_1^r \frac{\sqrt{\xi^2(u)u^2 - 1}}{u} \, du + C$$

where $\xi(u)$ characterizes said selected erosion pattern.

3. The magnetron sputtering source of claim 2 wherein said magnet means forms a generally heart-shaped curve.

4. The magnetron sputtering source of claim 3 wherein said heart-shaped curve is asymmetrical.

5. The magnetron sputtering source of claim 3 wherein said heart-shaped curve does not have a tip.

6. The magnetron sputtering source of claim 5 wherein the portion of said heart-shaped curve which lies farthest away from the axis of rotation of said magnet means forms an arc of a circle.

7. The magnetron sputtering source of claim 1 wherein said magnet means comprises an array of individual magnets disposed on said curve.

8. The magnetron sputtering source of claim 1 wherein said magnet means is not heart-shaped.

9. The magnetron sputtering source of claim 1 wherein said sputter target defines a non-planar surface and said curve is defined by $$\theta = \int_1^r \sqrt{1 + \left(\frac{dz}{dr}\right)^2} \cdot \sqrt{r^2 \xi(r)^2 + 1} \ \frac{dr}{r} + C$$

where $\xi(u)$ is said preselected erosion pattern, $z(r)$ defines said surface, and $C$ is a selected constant.

10. A magnetron sputtering source for depositing a thin film layer on a substrate comprising:
a generally circular, planar target having a face from which material is sputtered and defining a central magnet means positioned behind said target face and rotatable about said central axis, said magnet means configured to produce a predetermined erosion pattern in said sputter target and defining a generally heart-shaped, closed-loop centerline, the portion of said centerline which is farthest away from said central axis lying on an arc of a circle.

11. The magnetron sputtering apparatus of claim 10 wherein the portion of said centerline which lies on said arc is at least twenty-five percent of the overall length of the centerline.

12. The magnetron sputtering apparatus of claim 10 wherein said centerline comprises at least one portion having a convex shape relative to the interior of said closed loop centerline, and at least two portions having a concave shape relative to the interior of said closed loop centerline.

13. A magnetron sputtering source for depositing a thin film layer on a substrate comprising:
a planar target having a face from which material is sputtered,
rotatable magnet means positioned behind said target face, said magnet means defining a generally heart-shaped, closed-loop centerline, said closed loop centerline being asymmetrical such that no half of said closed loop centerline is a mirror image of another other half.

14. A method of configuring a closed-loop magnet means rotatable about an axis for use in a magnetron sputtering apparatus to obtain a desired erosion pattern in a sputter target adjacent to said magnet means, comprising the steps of:
positioning a closed-loop magnet means having a centerline conforming to a desired shape behind said sputter target,
forming an erosion groove in said target surface while holding said magnet means in a stationary position,
measuring the shape and position of the erosion groove,
adjusting the position of said closed-loop magnet means to have a new centerline at at least one point, such that when said magnet means is rotated a predetermined erosion profile in said sputter target is obtained, taking into account the shape of the erosion groove and the distance between the position of the centerline and the position of the erosion groove.

15. The method of claim 14 wherein the step of measuring the shape of the erosion groove comprises measuring the erosion depth of the sputter target at points along a plurality of radial lines from the axis of rotation of said magnet means.

16. The method of claim 14 wherein the step of measuring the shape of the erosion groove comprises measuring the erosion depth of the sputter target at points along a plurality of concentric circles centered on the axis of rotation of said magnet means.

17. The method of claim 14 wherein the step of measuring the shape of said erosion groove comprises forming an array wherein each entry comprises a positional measurement and an erosion depth measurement.

18. The method of claim 17 wherein said positional measurement is expressed in polar coordinates.

19. The method of claim 14 wherein said erosion shape measurements are used to create a calculated erosion profile generated when sputtering is performed while the magnet is rotated.

20. The method of claim 14 comprising the step of generating a set of functions, based on said measured erosion shape, representing the cross-sectional erosion profile at a finite number of angles.

21. The method of claim 20 wherein said set of generated functions are polynomials.

22. The method of claim 21 wherein said polynomials are fifth-order polynomials.

23. The method of claim 14 wherein said steps of adjusting the position of the magnet comprises the step of calculating the erosion profile that will be obtained when the position of the centerline of the magnet means is changed at at least one point.

24. The method of claim 23 wherein said step of calculating the erosion profile that will be obtained when the position of the centerline of the magnet means is changed at at least one point is iteratively performed.

25. The method of claim 14 wherein said step of adjusting the position of the magnet means comprises the step of calculating a characteristic of the film deposited on a wafer that will be obtained when the position of the centerline of the magnet means is changed at at least one point.

26. The method of claim 25 wherein said characteristic of the film is uniformity of thickness.

27. A method of configuring a closed-loop, rotatable magnet means for use in a magnetron sputtering apparatus to obtain a sputtered film having a desired characteristic on a substrate, said closed-loop magnet being configured to yield a predetermined erosion profile in a sputter target, wherein the shape of said predetermined erosion profile is determined in a manner comprising the following steps:
determining a distribution function defining to at least the first order the angular distribution of atoms ejected from the surface of a sputter target made of the material being sputtered under the operating conditions of the sputtering apparatus, determining the spacing between the surface of the sputter target and the substrate, determining the size of the sputter target relative to the size of the substrate, and calculating the erosion profile that will result in a desired film characteristic on said substrate, taking into account the operating conditions of the sputtering apparatus, the spacing between the surface of the sputter target and the substrate, the distribution function and the sizes of the substrate and the target.

28. The method of claim 27 wherein said desired film characteristic is uniformity of film thickness.

29. The method of claim 27 wherein said desired film characteristic is step coverage.

30. The method of claim 27 wherein said desired film characteristic is via filling.

* * * * *

UNITED STATES PATENT AND TRADEMARK OFFICE
CERTIFICATE OF CORRECTION

PATENT NO. : 5,314,597

DATED : May 24, 1994

INVENTOR(S) : David J. Harra

It is certified that error appears in the above-identified patent and that said Letters Patent is hereby corrected as shown below:

In claim 10, column 19, line 32, add the word --axis,--after the word "central".

Signed and Sealed this

Twenty-seventh Day of October, 1998

Attest:

BRUCE LEHMAN

Attesting Officer

Commissioner of Patents and Trademarks